(12) United States Patent
Hui

(10) Patent No.: US 10,146,092 B2
(45) Date of Patent: Dec. 4, 2018

(54) PIXEL ELECTRODE LAYER STRUCTURE WITH PERIPHERY FILLING PATTERN OF TFT-LCD, METHOD FOR MANUFACTURING THE SAME AND MASK THEREFOR

(75) Inventor: Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 394 days.

(21) Appl. No.: 13/271,318

(22) Filed: Oct. 12, 2011

(65) Prior Publication Data

US 2012/0092607 A1    Apr. 19, 2012

(30) Foreign Application Priority Data

Oct. 15, 2010  (CN) .......................... 2010 1 0517781

(51) Int. Cl.
 *G02F 1/1334*  (2006.01)
 *G02F 1/1333*  (2006.01)
 *G02F 1/1343*  (2006.01)
 *H01L 27/12*   (2006.01)

(52) U.S. Cl.
 CPC ............. *G02F 1/134336* (2013.01); *G02F 2001/133388* (2013.01); *G02F 2001/134372* (2013.01); *H01L 27/1288* (2013.01)

(58) Field of Classification Search
 USPC .................................................. 349/43, 143
 See application file for complete search history.

(56) References Cited

U.S. PATENT DOCUMENTS

| | | | |
|---|---|---|---|
| 6,373,544 B1 * | 4/2002 | Hirabayashi | G02F 1/136277 257/E27.111 |
| 2004/0125320 A1 * | 7/2004 | Bouten | G02F 1/133305 349/156 |
| 2005/0270467 A1 | 12/2005 | Lee | |
| 2006/0146255 A1 * | 7/2006 | Ahn | 349/141 |
| 2008/0024415 A1 * | 1/2008 | Jung et al. | 345/92 |

FOREIGN PATENT DOCUMENTS

| | | |
|---|---|---|
| CN | 101114657 A | 1/2008 |
| JP | 11-072804 A | 3/1999 |
| JP | 2004-069829 A | 3/2004 |
| JP | 2005-283862 A | 10/2005 |

(Continued)

OTHER PUBLICATIONS

First Chinese Office Action dated May 4, 2014; Appln. No. 201110095453.3.

(Continued)

*Primary Examiner* — Lauren Nguyen
(74) *Attorney, Agent, or Firm* — Ladas & Parry LLP

(57) ABSTRACT

The disclosed technology provides a TFT-LCD pixel electrode layer structure comprising: a pixel electrode pattern corresponding to a display region of a liquid crystal panel; a peripheral region pattern corresponding to a non-display region of the liquid crystal panel; and a periphery filling pattern in a portion of the non-display region where no peripheral region pattern is formed. The disclosed technology may be applied to manufacture of a liquid crystal display. The disclosed technology further provides a method for forming a TFT-LCD pixel electrode layer structure and a mask therefor.

12 Claims, 3 Drawing Sheets

(56) References Cited

FOREIGN PATENT DOCUMENTS

| | | |
|---|---|---|
| JP | 2008-033317 A | 2/2008 |
| JP | 2008-064900 A | 3/2008 |
| JP | 2010-020146 A | 1/2010 |
| JP | 2010-186116 A | 8/2010 |
| JP | 2011-164189 A | 8/2011 |
| KR | 1020040064308 A | 7/2004 |
| KR | 20060079040 A | 7/2006 |
| KR | 20080010522 A | 1/2008 |

OTHER PUBLICATIONS

Japanese office Action Appln. No. 2011-226726; dated Apr. 27, 2015.

Japanese Office Action dated Dec. 15, 2015; Appln. No. 2011-226726.

* cited by examiner

PIXEL ELECTRODE LAYER STRUCTURE WITH PERIPHERY FILLING PATTERN OF TFT-LCD, METHOD FOR MANUFACTURING THE SAME AND MASK THEREFOR

BACKGROUND

The disclosed technology relates to a pixel electrode layer structure of a thin film transistor liquid crystal display (TFT-LCD), a method for manufacturing the same and a mask therefor.

Thin Film Transistor-Liquid Crystal Displays (TFT-LCDs) have dominated the current flat panel display market because of extraordinary characteristics such as thin profile and lightweight, low power consumption, no radiation and the like. However, liquid crystal displays have a drawback that its viewing angle is relatively small. For this reason, wide viewing angle technologies have been developed. Fringe Field Switch (FFS) technology, as one of various wide viewing angle technologies, generates a fringe field between transparent electrodes such that liquid crystal molecules between the transparent electrodes and over the transparent electrodes may rotate in a plane parallel to a substrate or in a plane inclined with respect to the substrate, thereby improving the viewing angle while increasing the transmittance of the liquid crystal layer.

Generally, an FFS-type TFT-LCD liquid crystal panel may comprise a glass substrate; a gate electrode, a gate line and a common electrode faulted on the glass substrate, the common electrode comprising a common electrode line and a transparent electrode; a gate insulating layer formed on the gate electrode, the gate line and the common electrode, covering the entire glass substrate; an active layer formed on the gate insulating layer and positioned over the gate electrode; a source/drain electrode layer formed on the active layer and forming a data line substantially perpendicular to the gate line and the source and drain electrodes; a passivation layer formed on the source and drain electrodes and covering the entire glass substrate, the passivation layer having a through-hole formed therein; and a pixel electrode formed on the passivation layer and electrically connected to the source/drain electrode through the through-hole.

During manufacture of the conventional FFS-type TFT-LCD liquid crystal panel, a mask for the pixel electrode layer structure is divided into two parts, i.e., a display region mask pattern and a peripheral region mask pattern. As shown in FIG. 1, typically, the display region mask pattern 1 comprises an array of pixel electrode mask patterns 11, and the peripheral region mask pattern 2 comprises a driving circuitry mask pattern 21, a electrical performance testing mask pattern 22, a shadow plate registration mark 23, an interlayer registration mark 24, a substrate-to-mask registration mark 25 and the like, each of which has a relative small area.

In a developing step for manufacture of the pixel electrode layer structure, area of the photoresist layer remaining for the peripheral circuitry mask pattern 2 is relatively small and thus most of the photoresist layer reacts with the developer, consuming a large amount of developer. In contrast, the photoresist layer remains in a relatively large area in the display region, consuming a less amount of developer. In this case, there is a difference in concentration of the developer between periphery and central portion of the panel, resulting in an ununiform distribution of the developer concentration across the entire panel.

In manufacturing of the pixel electrode layer structure in the FFS-type TFT-LCD array substrate, as a develop inspection critical dimension (DICD) is generally small (about 4.0 μm), DICD may be affected by the concentration of the developer and thus change considerably.

As a result, a plurality of twill-like mura 3 may be generated in the display region when the pixel electrode layer structure is formed during manufacture of the FFS-type TFT-LCD array substrate, as shown in FIG. 2. The twill-like mura is resulted from deteriorative uniformity of line width of the pixel electrode layer structure throughout the panel. When the panel operates, the twill-like mura may induce twill-like bright lines, causing a quality-deteriorated or even abnormal display and thereby decreasing the yield.

SUMMARY

An aspect of the disclosed technology provides a thin film transistor liquid crystal display (TFT-LCD) pixel electrode layer structure comprising: a pixel electrode pattern corresponding to a display region of a liquid crystal panel of the TFT-LCD; a peripheral region pattern corresponding to a non-display region of the liquid crystal panel; and a periphery filling pattern in a portion of the non-display region where no peripheral region pattern is formed.

Another aspect of the disclosed technology provides a mask for a thin film transistor liquid crystal display (TFT-LCD) pixel electrode layer structure, the mask comprising: a pixel electrode mask pattern corresponding to a display region of a liquid crystal panel of the TFT-LCD for forming a pixel electrode pattern; a peripheral region mask pattern corresponding to a non-display region of the liquid crystal panel for forming a peripheral region pattern; and a periphery filling mask pattern for forming a periphery filling pattern, the periphery filling pattern corresponding to a portion of the non-display region where no peripheral region pattern is formed.

Still another aspect of the disclosed technology provides a method for forming a thin film transistor liquid crystal display (TFT-LCD) pixel electrode layer structure, the method comprising: coating a layer of photoresist on a substrate having a pixel electrode metal layer formed thereon; disposing a mask over the photoresist with a spacing therebetween, the mask comprising: a pixel electrode mask pattern corresponding to a display region of a liquid crystal panel of the TFT-LCD for forming a pixel electrode pattern; a peripheral region mask pattern corresponding to a non-display region of the liquid crystal panel for forming a peripheral region pattern; and a periphery filling mask pattern for forming a periphery filling pattern, the periphery filling pattern corresponding to a portion of the non-display region where no peripheral region pattern is formed; and forming the pixel electrode layer pattern by a patterning process.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology. It is to be understood that the drawings show merely some rather than all of embodiments of the disclosed technology, and those skilled in the art may obtain many other drawings based on the accompanying drawings without any creative work.

DETAILED DESCRIPTION

The disclosed technology now will be described more fully hereinafter with reference to the accompanying drawings, in which the embodiments of the disclosed technology are shown. It is to be understood that embodiments described herein are merely some rather than all of embodiments of the disclosed technology. Those skilled in the art may obtain many other embodiments on the basis of the embodiments disclosed herein, and all of such embodiments are within the scope of the disclosed technology.

Embodiments of the disclosed technology provides a TFT-LCD pixel electrode layer structure capable of reducing or eliminating the twill-like mura due to the developer concentration ununiformity, a method for forming the TFT-LCD pixel electrode layer structure, and a mask for forming the TFT-LCD pixel electrode layer structure.

Hereinafter, a technical solution of the disclosed technology will be explained by means of exemplary embodiments.

First Embodiment

In the developing process for forming the pixel electrode layer structure, the photoresist layer (for example, a positive photoresist layer) remains in a small area in the non-display region since the corresponding peripheral region mask pattern has a small area in the non-display region. Thus, most of the photoresist layer reacts with the developer, consuming a large amount of developer. In contrast, the photoresist layer remains in a relatively large area in the display region, consuming a less amount of developer. As a result, there is a difference in concentration of the developer between periphery (the non-display region) and central portion (the display region) of the panel, causing an ununiform distribution of the developer concentration across the entire panel. Specifically, concentration of the developer may be much larger in the central portion of the panel than in the periphery of the panel, and the developer may diffuse from the panel center towards the panel periphery. DICD may be affected by concentration of the developer such that line width of the pixel electrode layer structure is ununiform across the substrate, resulting in a twill-like mura.

Figure 1:
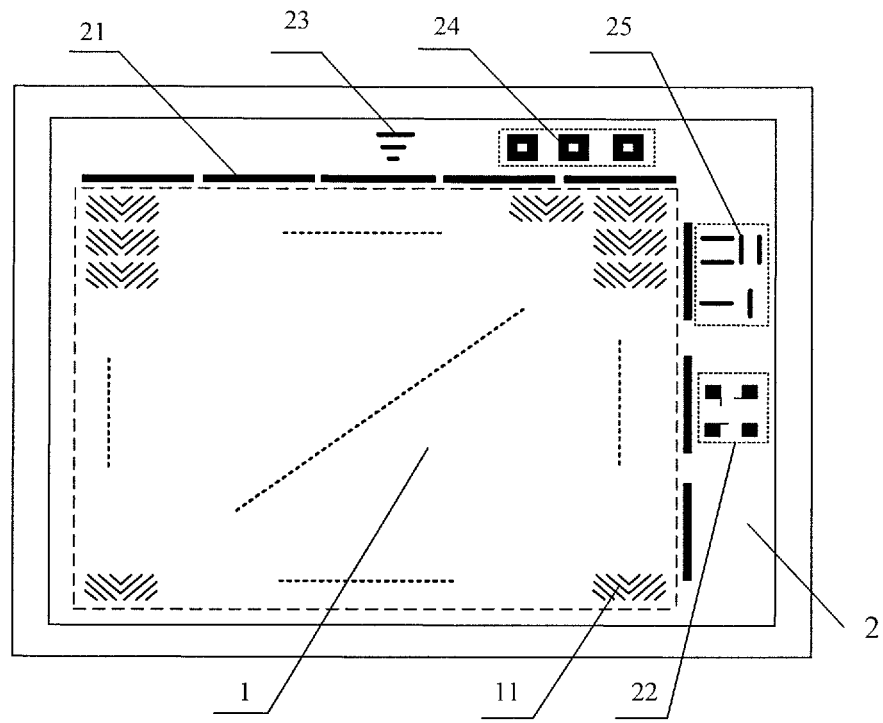
FIG. 1 is a schematic illustration of a pixel electrode layer structure according to the prior art.
Figure 2:
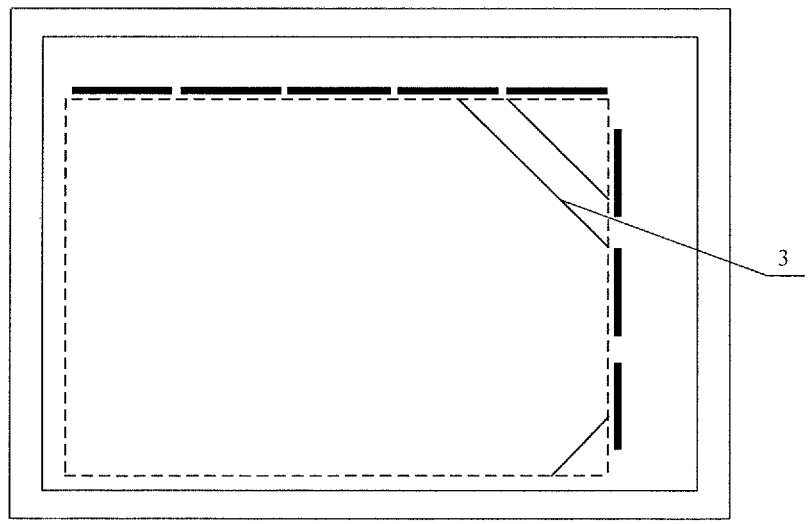
FIG. 2 is a schematic illustration showing a twill-like mura of a liquid crystal panel according to the prior art.
Figure 3:
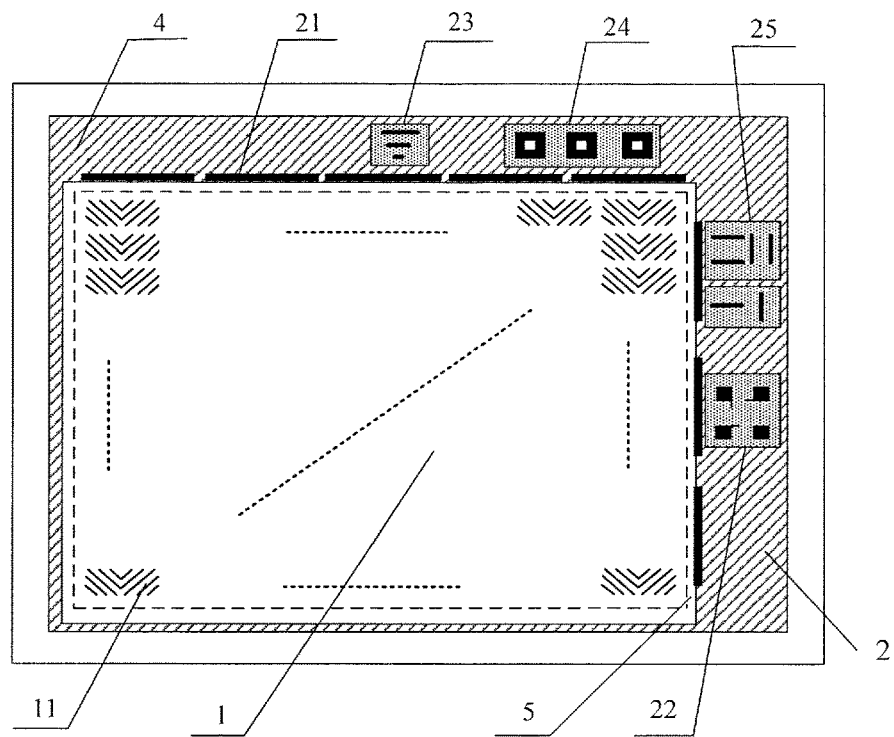
FIG. 3 is a schematic illustration showing a pixel electrode layer structure according to an exemplary embodiment of the disclosed technology.

Facing the problem and eliminate the twill-like mura, uniformity critical dimension (CD) has to be controlled. That is, concentration distribution of the developer needs to be controlled in the developing process. The exemplary embodiment of the disclosed technology provides a pixel electrode layer structure. As shown in FIG. 3, the pixel electrode layer structure comprises a pixel electrode pattern 11 corresponding to a display region of the liquid crystal panel, a peripheral region pattern 2 corresponding to a non-display region of the liquid crystal panel, and a periphery filling pattern 4 disposed in a portion of the non-display region where no peripheral region pattern 2 is disposed.

The pixel electrode layer structure may be formed by using of a pixel electrode layer mask according to an exemplary embodiment of the disclosed technology. The mask comprises a pixel electrode mask pattern for forming the pixel electrode pattern corresponding to the display region of the liquid crystal panel, a peripheral region mask pattern for forming the peripheral region pattern corresponding to the non-display region of the liquid crystal panel, and a periphery filling mask pattern for forming a periphery filling pattern, the periphery filling pattern being provided in a portion of the non-display region where no periphery filling mask pattern is disposed.

It can be understood that in the photolithograph process for formation of the array substrate, if positive photoresist is used, the mask pattern is consistent with the pattern of the pixel electrode layer shown in FIG. 3 which is obtained through a patterning process. Specifically, the pixel electrode pattern in the display region and the peripheral region pattern and the periphery filling pattern in the peripheral region remain while the rest part is etched away. If negative photoresist is used, the mask pattern is reverse to the pattern of the pixel electrode layer shown in FIG. 3 which is obtained through a patterning process. Specifically, the pixel electrode pattern in the display region and the peripheral region pattern and the periphery filling pattern in the peripheral region are etched away while the rest part remains.

The peripheral region pattern in the pixel electrode layer may comprise a driving circuitry pattern 21, an electrical performance testing pattern 22, a shadow plate registration mark 23, an interlayer registration mark 24, a substrate-to-mask registration mark 25 and the like, which have a relative small area. These patterns comprise the function circuits or elements.

In the present exemplary embodiment, the non-display region pattern and the display region pattern may be distributed uniformly in the pixel electrode layer structure of the resultant pixel electrode layer by providing a new mask pattern for the peripheral region of the pixel electrode layer mask. The periphery filling mask pattern may be provided in a portion of the non-display region, where no peripheral region mask pattern is disposed, to reduce photoresist to be reacted in the peripheral region, such that the difference in concentration of the developer between periphery and central portion of the panel can be reduced and uniformity of the developer concentration can be ensured across the panel during the development. Accordingly, the CD of the pixel electrode may remain uniform across the panel, avoiding generation of the twill-like mura during manufacture of the FFS-type TFT-LCD array substrate.

Second Embodiment

On the basis of the first embodiment, further, as shown in FIG. 3, the periphery filling pattern 4 is separated from and independent of patterns included in the peripheral region pattern. To prevent interference between the periphery filling pattern and patterns included in the peripheral region pattern and prevent affect on function of the peripheral region pattern, the periphery filling pattern is spaced apart from the peripheral driving circuitry pattern, the process testing pattern, the shadow plate registration pattern or the like such that the conventional peripheral region patterns and the periphery filling pattern are independent of one another.

Furthermore, a margin space 5 may be provided between boundaries of the periphery filling pattern 4 and the pixel electrode pattern 1 since it may be difficult for the remaining ratio of the photoresist to be the same in the display region as in the non-display region after exposure with the mask of the present exemplary embodiment. The margin space 5 may have a width of about 2-5 mm. By providing the margin space 5 between boundaries of the periphery filling pattern and the pixel electrode pattern in the display region, a transition zone is formed to avoid flow between developer zones having a concentration difference therebetween in contact with each other, maintaining a transition uniform to some extent.

In the present exemplary embodiment, the pixel electrode layer structure can be formed with a non-display region pattern and a display region pattern distributed uniformly by providing a new pattern in the peripheral region of the pixel electrode layer mask. Specifically, the periphery filling pattern, which is independent of the peripheral region pattern, may be provided in a portion of the non-display region where no peripheral region pattern is disposed to reduce photoresist to be reacted in the peripheral region without interference with the peripheral region pattern, such that the difference in concentration of the developer between the panel periphery and the panel central portion can be reduced and uniformity of the developer concentration can be ensured across the panel during the development. Further, the transition zone may be formed by providing the margin space between boundaries of the peripheral region pattern and the periphery filling pattern, so as to avoid flow between developer zones having a concentration difference therebetween in contact with each other. Accordingly, the CD uniformity of the pixel electrode can be effectively controlled to avoid generation of the twill-like mura during manufacture of the FFS-type TFT-LCD array substrate, preventing a quality-deteriorated or even abnormal display and thereby improving the yield.

Third Embodiment

By increasing area of the pattern remaining in the peripheral region, i.e., by providing the periphery filling pattern, the remaining photoresist layer may have a proper area such that concentration of the developer in the peripheral region is the same as that in the display region during development. Since the peripheral region patterns have a small area, and difference between the patterns affects little, the periphery filling pattern of the above embodiments may be further designed with a pattern texture the same as that of the pixel electrode pattern. Thus, to the high extent, concentration of the developer in the peripheral region may be the same as that in the display region during development.

Figure 4:
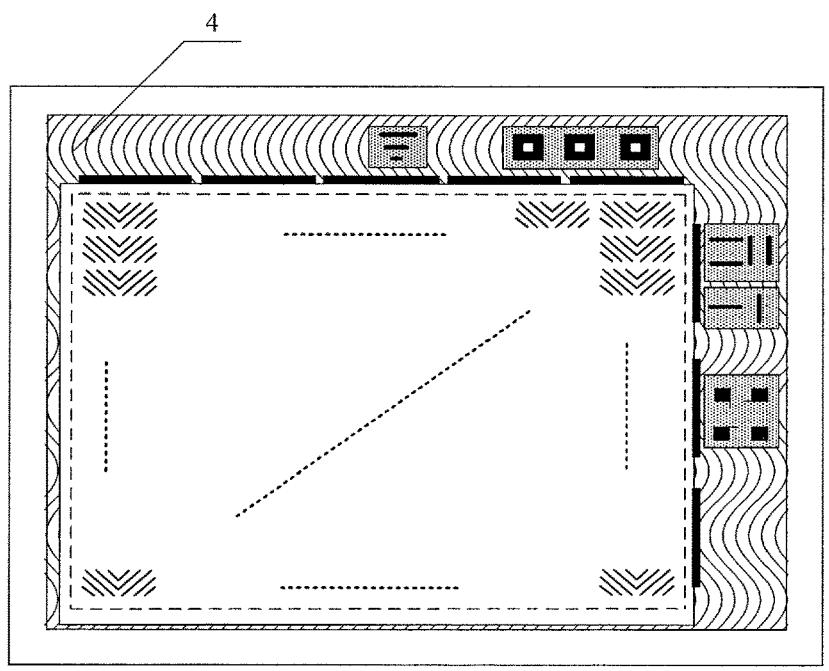
FIG. 4 is a schematic illustration showing a pixel electrode layer structure according to another exemplary embodiment of the disclosed technology.
Figure 5:
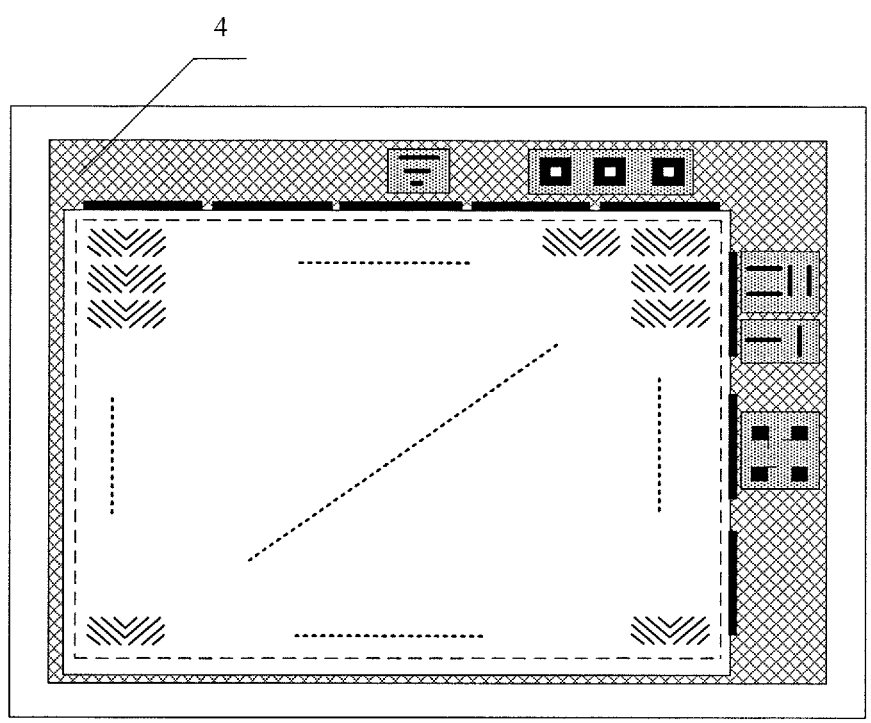
FIG. 5 is a schematic illustration showing a pixel electrode layer structure according to still another exemplary embodiment of the disclosed technology.

Since concentration of the developer can not be exactly the same in the peripheral region as in the display region during the development, texture of the periphery filling pattern may be designed to have a long-stripe shape as shown in FIG. 3, a wave-stripe shape as shown in FIG. 4, or a mesh shape as shown in FIG. 5. In the present embodiment, shapes of the periphery filling pattern are merely for purpose of illustration, but not limiting of the disclosed technology. The illustrated shapes of the periphery filling pattern each can effectively prevent flow of the developer caused by concentration difference thereof.

The present exemplary embodiment can reduce amount of the photoresist to react in the peripheral region by providing a new pattern in the peripheral region of the pixel electrode layer mask, specifically, by providing the periphery filling pattern in the portion of the non-display region where no peripheral region pattern is formed. By design of the periphery filling pattern, the remaining photoresist can have a proper area such that difference in concentration of the developer between the peripheral region and the display region can be reduced or eliminated during the developing process, and uniformity of the developer concentration may be ensured across the panel during the development. Thus, CD uniformity of the pixel electrode may be effectively controlled to avoid generation of the twill-like mura during manufacture of the FFS-type TFT-LCD array substrate, preventing a quality-deteriorated or even abnormal display due to the mura and thereby improving the yield.

Fourth Embodiment

The present exemplary embodiment further provides a method for forming an FFS-type TFT-LCD pixel electrode layer structure by using of a mask according to any one of the above embodiments, the method comprising:

Step 101, coating a photoresist layer on a substrate having a pixel electrode metal layer formed thereon;

Step 102, disposing the mask over the photoresist layer with or without a spacing therebetween, the mask comprising a pixel electrode mask pattern corresponding to a display region of a liquid crystal panel for forming a pixel electrode pattern, a peripheral region mask pattern corresponding to the non-display region of the liquid crystal panel for forming a peripheral region pattern, and a periphery filling mask pattern for forming a periphery filling pattern, the periphery filling mask pattern being provided in a portion of the non-display region where no peripheral region mask pattern is provided, wherein the peripheral region mask pattern comprises a driving circuitry mask pattern, an electrical testing mask pattern, a shadow plate registration mark, a interlayer registration mark, a substrate-to-mask registration mark and the like;

Step 103, forming the pixel electrode layer structure by a patterning process such as exposing, developing, etching and removing photoresist.

The mask employed in the method of the present exemplary embodiment is the same as that in the forgoing embodiments, and repetitive description thereof is omitted here.

The present exemplary embodiment can reduce amount of the photoresist to react in the peripheral region by providing a new pattern in the peripheral region of the pixel electrode layer mask, specifically, by providing the periphery filling pattern in the portion of the non-display region where no peripheral region pattern is formed. Thus, difference in concentration of the developer between periphery and central portion of the panel can be reduced or eliminated during the developing process, and uniformity of the developer concentration can be ensured across the panel during the development. Thus, the CD uniformity of the pixel electrode can be effectively controlled to avoid generation of the twill-like mura during manufacture of the FFS-type TFT-LCD array substrate.

Although the above embodiments are described in terms of the FFS-type TFT-LCD, the disclosed technology is not limited thereto. For example, a twist nematic (TN) TFT-LCD may also be used in the embodiments.

Those skilled in the art would clearly know from the above embodiments that the disclosed technology may be implemented by software with necessary hardware, or by hardware, firmware and the like, and in many cases the former is preferred. Based on such understanding, the embodiments of the disclosed technology may be embodied in part in a software form. The computer software may be stored in a readable storage medium such as a floppy disk, a hard disk or an optical disk of the computer. The computer software comprises a series of commands to make the computer (e.g., a personal computer, a service station or a network terminal) execute the method according to respective embodiment of the disclosed technology.

The disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. A thin film transistor liquid crystal display (TFT-LCD) pixel electrode layer structure, comprising:
   a pixel electrode pattern corresponding to a display region of a liquid crystal panel of the TFT-LCD;
   a plurality of peripheral region patterns corresponding to a non-display region of the liquid crystal panel; and
   a periphery filling pattern in a portion of the non-display region where no peripheral region patterns are formed,
   wherein the pixel electrode pattern, the peripheral region patterns and the periphery filling pattern are formed of a same material, the periphery filling pattern is different from the peripheral region patterns in function,
   wherein the non-display region is provided outside the display region, the non-display region comprises an upper portion provided on an upper side of the display region, a lower portion provided on a lower side of the display region, a left portion provided on a left side of the display region and a right portion provided on a right side of the display region, and
   wherein in at least one of the upper portion, the lower portion, the left portion and the right portion of the non-display region, the periphery filling pattern is provided on all sides of each of the peripheral region patterns and no other of the peripheral region patterns is provided between each of the peripheral region patterns and the periphery filling pattern.

2. The TFT-LCD pixel electrode layer structure according to claim 1, wherein the peripheral region pattern comprises an electrical performance testing pattern, a shadow plate registration mark, an interlayer registration mark or a substrate-to-mask registration mark.

3. The TFT-LCD pixel electrode layer structure according to claim 2, wherein the periphery filling pattern is separated from and independent of patterns included in the peripheral region pattern.

4. The TFT-LCD pixel electrode layer structure according to claim 1, wherein a margin space is disposed between a boundary of the periphery filling pattern facing the pixel electrode pattern and a boundary of the pixel electrode pattern facing the periphery filling pattern, and the margin space has a width of about 2 mm-5 mm.

5. The TFT-LCD pixel electrode layer structure according to claim 2, wherein a margin space is disposed between a boundary of the periphery filling pattern facing the pixel electrode pattern and a boundary of the pixel electrode pattern facing the periphery filling pattern, and the margin space has a width of about 2 mm-5 mm.

6. The TFT-LCD pixel electrode layer structure according to claim 3, wherein a margin space is disposed between a boundary of the periphery filling pattern facing the pixel electrode pattern and a boundary of the pixel electrode pattern facing the periphery filling pattern, and the margin space has a width of about 2 mm-5 mm.

7. The TFT-LCD pixel electrode layer structure according to claim 1, wherein the periphery filling pattern and the pixel electrode pattern comprise a same pattern texture.

8. The TFT-LCD pixel electrode layer structure according to claim 2, wherein the periphery filling pattern and the pixel electrode pattern comprise a same pattern texture.

9. The TFT-LCD pixel electrode layer structure according to claim 3, wherein the periphery filling pattern and the pixel electrode pattern comprise a same pattern texture.

10. The TFT-LCD pixel electrode layer structure according to claim 1, wherein the periphery filling pattern comprises a pattern texture of a gate-stripe shape, a wave-stripe shape or a mesh shape.

11. The TFT-LCD pixel electrode layer structure according to claim 1, wherein the TFT-LCD is of a fringe field switching (FFS)-type or a twist nematic (TN) type.

12. A thin film transistor liquid crystal display (TFT-LCD) pixel electrode layer structure, comprising:
   a pixel electrode pattern corresponding to a display region of a liquid crystal panel of the TFT-LCD;
   a peripheral region pattern corresponding to a non-display region of the liquid crystal panel; and
   a periphery filling pattern in a portion of the non-display region where no peripheral region pattern is formed,
   wherein the pixel electrode pattern, the peripheral region pattern and the periphery filling pattern are formed of a same material, the periphery filling pattern is different from the peripheral region pattern in function,
   wherein the non-display region is provided outside the display region, the non-display region comprises an upper portion provided on an upper side of the display region, a lower portion provided on a lower side of the display region, a left portion provided on a left side of the display region and a right portion provided on a right side of the display region, and
   wherein in at least two of the upper portion, the lower portion, the left portion and the right portion of the non-display region, the periphery filling pattern is provided on all sides of the peripheral region pattern.

* * * * *